United States Patent
Shih et al.

(10) Patent No.: US 11,384,430 B2
(45) Date of Patent: Jul. 12, 2022

(54) METHOD FOR CONDITIONING A CERAMIC COATING

(71) Applicant: Lam Research Corporation, Fremont, CA (US)

(72) Inventors: Hong Shih, Santa Clara, CA (US); Xiaomin Bin, San Jose, CA (US); Duane Outka, Fremont, CA (US); Eric A. Pape, Santa Cruz, CA (US); Gregory A. Pilgrim, Ithaca, NY (US); Girish M. Hundi, Dublin, CA (US); Cliff La Croix, Gardnerville, NV (US)

(73) Assignee: Lam Research Corporation, Fremont, CA (US)

( * ) Notice: Subject to any disclaimer, the term of this patent is extended or adjusted under 35 U.S.C. 154(b) by 26 days.

(21) Appl. No.: 17/255,635

(22) PCT Filed: Jul. 1, 2019

(86) PCT No.: PCT/US2019/040126
§ 371 (c)(1),
(2) Date: Dec. 23, 2020

(87) PCT Pub. No.: WO2020/009990
PCT Pub. Date: Jan. 9, 2020

(65) Prior Publication Data
US 2021/0280393 A1    Sep. 9, 2021

Related U.S. Application Data

(60) Provisional application No. 62/693,604, filed on Jul. 3, 2018.

(51) Int. Cl.
*C23C 16/44* (2006.01)
*H01J 37/32* (2006.01)

(52) U.S. Cl.
CPC .... *C23C 16/4407* (2013.01); *H01J 37/32477* (2013.01); *H01J 37/32862* (2013.01)

(58) Field of Classification Search
CPC ............ C23C 16/4407; H01J 37/32477; H01J 37/32862
See application file for complete search history.

(56) References Cited

U.S. PATENT DOCUMENTS 5,861,086 A    1/1999   Khurana et al.
6,242,111 B1 *  6/2001   Telford ............. H01L 23/53219
                                              428/629

(Continued)

FOREIGN PATENT DOCUMENTS

JP    2003-126794    5/2003
KR    10-2003-0038369    5/2003

OTHER PUBLICATIONS

International Search Report dated Oct. 22, 2019 from International Application No. PCT/US2019/040126.

(Continued)

*Primary Examiner* — Sharidan Carrillo
(74) *Attorney, Agent, or Firm* — Beyer Law Group LLP

(57) ABSTRACT

A method for conditioning ceramic coating on a part for use in a plasma processing chamber is provided. The ceramic coating is wetted with a solution, wherein the solution is formed by mixing a solvent with an electrolyte, wherein from 1% to 10% of the electrolyte dissociates in the solution. The ceramic coating is blasted with particles. The ceramic coating is rinsed.

16 Claims, 3 Drawing Sheets

(56) References Cited

U.S. PATENT DOCUMENTS

| | | |
|---|---|---|
| 7,211,156 B2 | 5/2007 | Yamaguchi et al. |
| 2002/0006766 A1 | 1/2002 | Haerle et al. |
| 2006/0159940 A1* | 7/2006 | Bhatnagar ............. C23C 14/081 204/192.15 |
| 2015/0132602 A1* | 5/2015 | Sun ....................... C23C 28/321 205/333 |
| 2017/0159164 A1 | 6/2017 | Huang et al. |
| 2021/0280393 A1* | 9/2021 | Shih .................. H01J 37/32477 |

OTHER PUBLICATIONS

Written Opinion dated Oct. 22, 2019 from International Application No. PCT/US2019/040126.

* cited by examiner

METHOD FOR CONDITIONING A CERAMIC COATING

CROSS REFERENCE TO RELATED APPLICATION

This application claims the benefit of priority of U.S. Provisional Application No. 62/693,604, filed Jul. 3, 2018, which is incorporated herein by reference for all purposes.

BACKGROUND

The disclosure relates to a method for conditioning a ceramic coating. More specifically, the disclosure relates to a method for conditioning a ceramic coating for a part used in a plasma processing chamber.

To make parts of a plasma processing chamber resistant to damage, ceramic coatings are used to cover parts of the plasma processing chamber. The ceramic coatings are conditioned to reduce and protect against contamination during plasma processing.

SUMMARY

To achieve the foregoing and in accordance with the purpose of the present disclosure, a method for conditioning ceramic coating on a part for use in a plasma processing chamber is provided. The ceramic coating is wetted with a solution, wherein the solution is formed by mixing a solvent with an electrolyte, wherein from 1% to 10% of the electrolyte dissociates in the solution. The ceramic coating is blasted with particles. The ceramic coating is rinsed.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EXEMPLARY EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Figure 1:
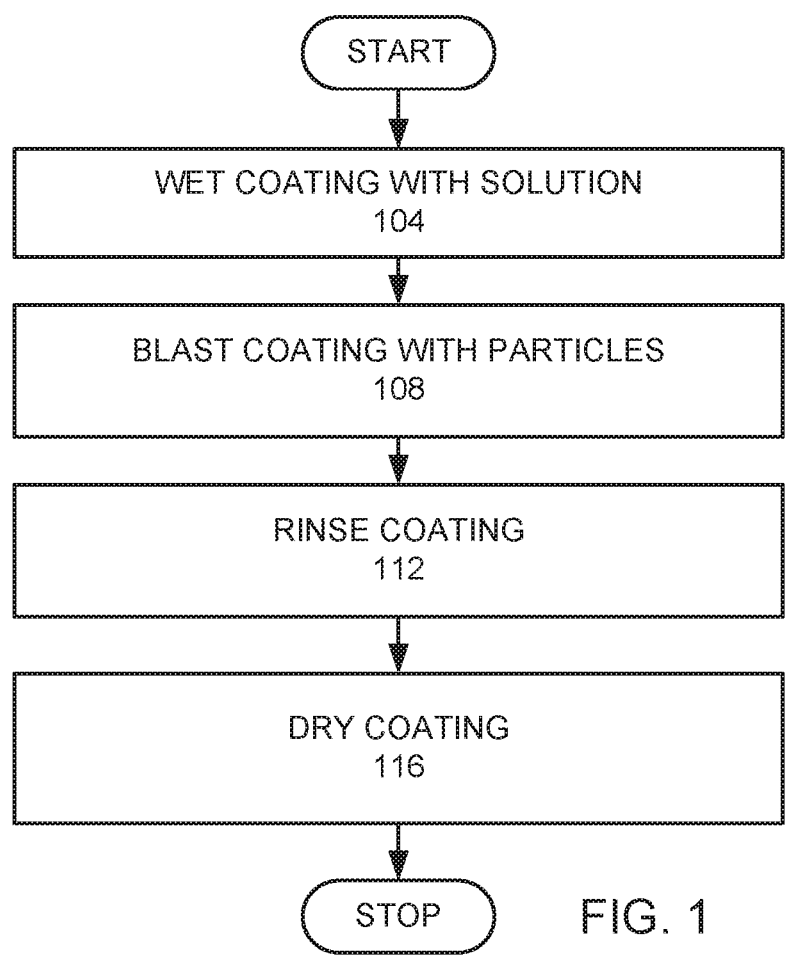
FIG. 1 is a high level flow chart of an embodiment.

FIG. 1 is a flow chart of an embodiment for conditioning a ceramic coating. A ceramic coating is wetted with a solution of a solvent and a weak electrolyte (step 104). The ceramic coating is blasted with particles (step 108). The ceramic coating is rinsed (step 112). The ceramic coating is dried (step 116).

Figure 2A:
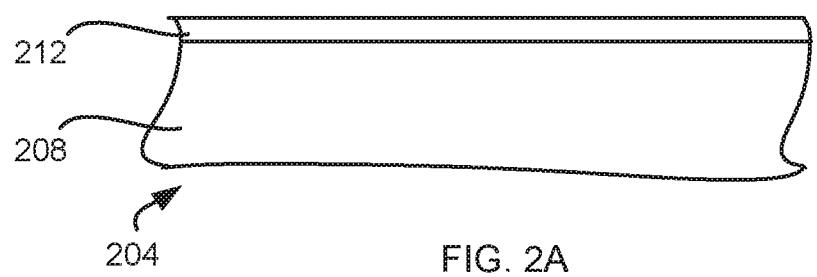
FIGS. 2A-C are schematic cross-sectional views of a surface of a part processed according to an embodiment.

FIG. 2A is a schematic cross-sectional view of a part 204. The part 204 has an aluminum body 208 with an anodized aluminum surface. A ceramic coating 212 is deposited over the anodized aluminum surface of the body 208. In this example, the ceramic coating 212 is alumina ($Al_2O_3$).

Figure 2B:
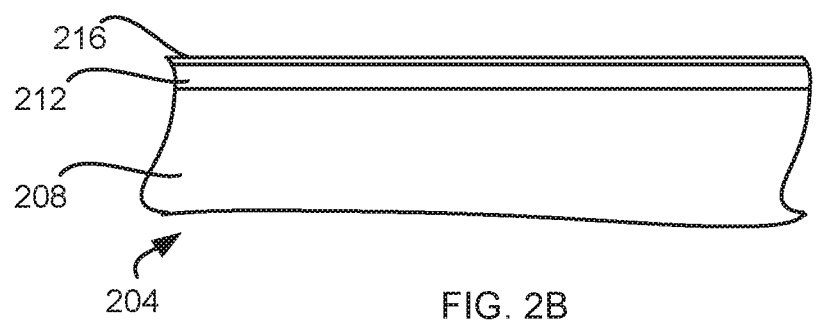

The ceramic coating 212 is wetted with a solution of a solvent and a weak electrolyte (step 104). In this embodiment, the solution is a mixture of a solvent of water and an electrolyte of ammonia acetate ($NH_4Ac$). The mixture forms a 0.1 M solution of $NH_4Ac$. In this embodiment, a sprayer is used to wet the ceramic coating 212 (step 104) by spraying the ceramic coating. FIG. 2B shows a wetting layer of the solution 216 on the ceramic coating 212.

The ceramic coating 212 is then blasted with particles (step 108), while wet with the solution. In this example, the particles are dry ice particles. Dry ice particles are frozen (solid) carbon dioxide ($CO_2$). Solid $CO_2$ in the form of fine shavings is used in combination with compressed air as the blasting gas to bombard the ceramic coating 212. In an embodiment, the solid $CO_2$ dry ice conditioning of the ceramic coating 212 is at approximately 20 to approximately 70 pounds per square inch (psi). The dry ice shavings are produced from high purity solid blocks or pellets passed through a hopper equipped with a series of rotary blades that is fed at rates between 0.5 pounds/min to 4 pounds/min. In an embodiment, the blasting step with dry ice particles is continued for approximately 30 seconds to approximately 10 minutes using a fan-shaped dispense nozzle that impinges a stream of submicron shaved ice particles within a 1-1.5 inch swath spray pattern on to the ceramic coating 212 from a distance ranging from approximately 1-12 inches away at an angle that ranges anywhere from shallow glancing to orthogonal with the ceramic coating 212. In another embodiment, the $CO_2$ dry ice blasting is continued for approximately 2 to approximately 30 minutes. In this embodiment, the wetting the ceramic coating 212 (step 104) also sprays the ceramic coating 212 during the blasting the ceramic coating 212 (step 108) in order to keep the ceramic coating 212 wet.

The ceramic coating 212 is rinsed with pressurized deionized water (step 112).

Figure 2C:
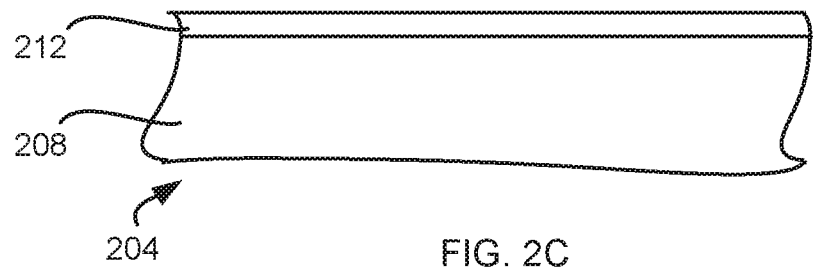

The ceramic coating 212 is dried (step 116). In this example, pressurized nitrogen ($N_2$) gas is directed at the ceramic coating 212 to dry the ceramic coating 212 (step 116). FIG. 2C shows the ceramic coating 212 after the drying process (step 116).

Figure 3:
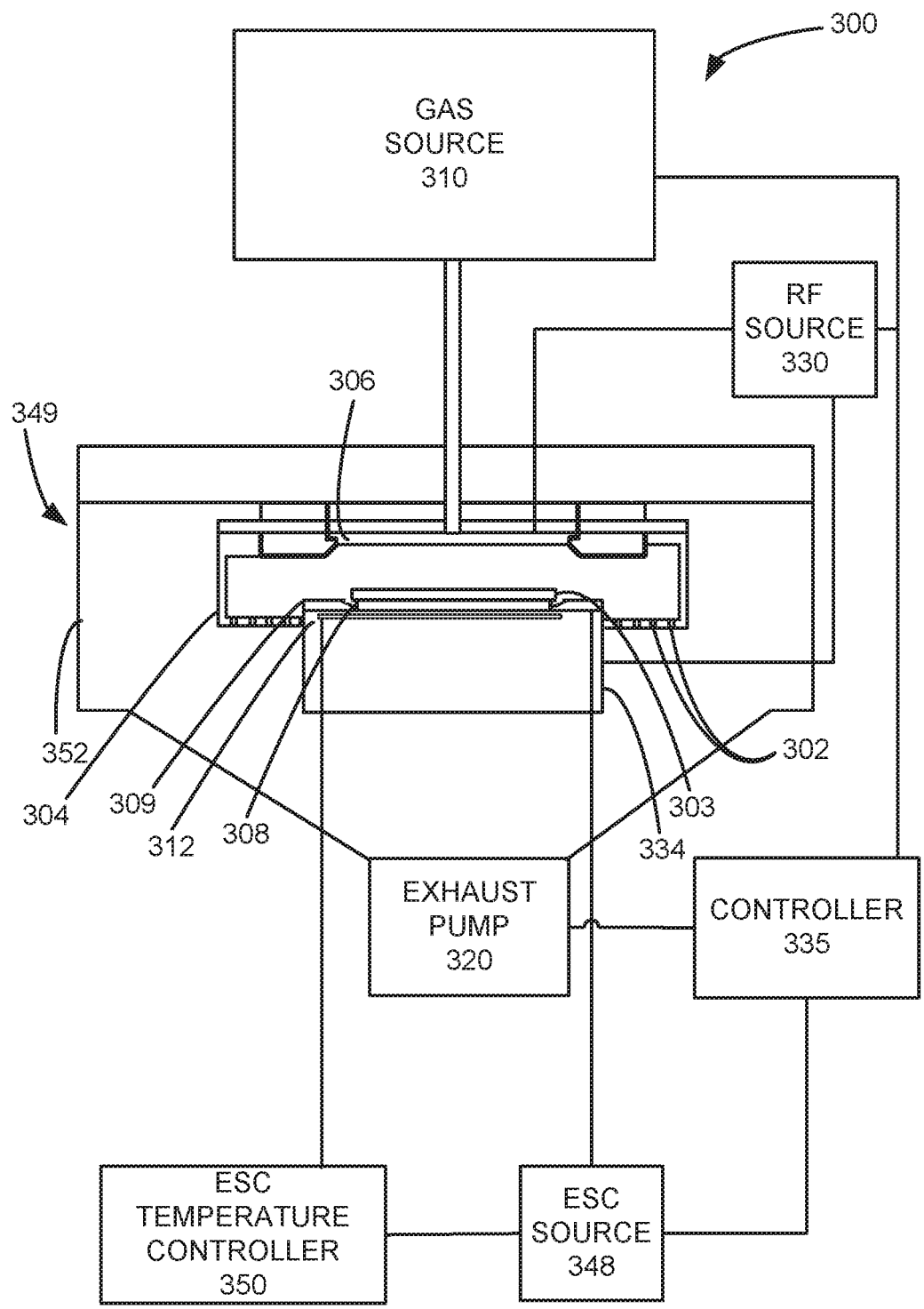
FIG. 3 is a schematic view of a plasma processing chamber with at least one part conditioned according to an embodiment.

The part may then be installed and used in a plasma processing chamber. The ceramic coating 212 is able to provide protection in etch plasma environments. FIG. 3 is a schematic view of an etch reactor in which an embodiment may be used. In one or more embodiments, a plasma processing chamber 300 comprises a gas distribution plate 306 providing a gas inlet and an electrostatic chuck (ESC) 308, within an etch chamber 349, enclosed by a chamber wall 352. Within the etch chamber 349, a wafer 303 is positioned over the ESC 308. The ESC 308 is a substrate support. An edge ring 309 surrounds the ESC 308. An ESC source 348 may provide a bias to the ESC 308. A gas source 310 is connected to the etch chamber 349 through the gas distribution plate 306. An ESC temperature controller 350 is connected the ESC 308.

A radio frequency (RF) source 330 provides RF power to a lower electrode and/or an upper electrode. In this embodiment, the lower electrode is the ESC 308 and the upper electrode is the gas distribution plate 306. In an exemplary embodiment, 400 kilohertz (kHz), 60 megahertz (MHz), 2 MHz, 13.56 MHz, and/or 27 MHz power sources make up the RF source 330 and the ESC source 348. In this embodiment, the upper electrode is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments.

A controller 335 is controllably connected to the RF source 330, the ESC source 348, an exhaust pump 320, and the gas source 310. A high flow liner 304 is a liner within the etch chamber 349. The high flow liner 304 confines gas from the gas source and has slots 302. The slots 302 allow for a controlled flow of gas to pass from the gas source 310 to the exhaust pump 320. In this example, the ESC 308 may have the ceramic coating 212 (not shown in FIG. 3) to make the ESC 308 more resistant to plasma etching.

The conditioning of the coating by blasting the coating with particles has been found to make the coating useful for plasma processing. The conditioning of the coating by blasting the coating with particles reduces the amount of seasoning required before the part can be used for processing wafers or other workpieces. Seasoning is a process in which an empty etch chamber 349 or an etch chamber 349 with a blank wafer is powered in order to condition the chamber to process wafers uniformly and with reduced defects. Increased seasoning time means increased downtime for the etch chamber and increased power costs. For ceramic coatings 212 on an ESC 308, loose particles on the ESC 308 are removed by the placement of a wafer on the ESC 308. The removed particles act as contaminants. Several blank wafers may be serially placed in the chamber to remove loose particles on the ESC 308, as part of the seasoning process. The conditioning in the above embodiments reduces or eliminates the number of blank wafers previously needed for seasoning the ESC 308.

After the chamber has been seasoned and after several wafers have been processed, material from etch and deposition processes may deposit on the ceramic coating 212. Such material may become contaminants. Contaminants increase defects on subsequent wafers. Conditioning the ceramic coating 212 using various above embodiments removes such depositions and contaminants.

In various embodiments, the ceramic coating 212 is a dielectric. It has been found that blasting the ceramic coating 212 with particles without the solution creates an electrostatic charge on the ceramic coating 212 as high as 10,000 volts. A sufficiently high electrostatic charge causes arcing. Arcing may damage the ceramic coating 212 and the part. A damaged part may need to be replaced costing tens of thousands of dollars. Providing the solution 216 on the ceramic coating 212 allows the electrostatic charge to dissipate during the blasting the ceramic coating 212 with particles. In this embodiment, the electrostatic charge does not exceed a magnitude of 800 volts. As a result, arcing and resulting damage is eliminated.

In various embodiments, the solution may comprise a solvent such as water and a weak electrolyte, such as one or more of ammonium containing molecules in the form of a perborate ($NH_4BO_3$), carbonate (($NH_4)_2CO_3$) or $NH_4HCO_3$), citrate (($NH_4)_2HC_6H_5O_7$), formate ($NH_4CHO_2$); lactate ($NH_4C_3H_5O_3$), oxalate (($NH_4)_2C_2O_4$ or $NH_4HC_2O_4$), salicylate ($NH_4C_7H_5O_3$), succinate (($NH_4)_2C_4H_4O_4$), or tartrate (($NH_4)_2C_4H_4O_6$ or $NH_4HC_4H_4O_6$). In addition, a salt that produces ammonium ($NH_4^+$) and $B_2O_7$ may be used in another embodiment. The weak electrolyte does not contain a contaminant such as metal ions or halogen ions. In addition, salts that form strong electrolytes are not used. The weak electrolyte has from a 1% to 10% dissociation in water. The weak electrolyte has a boiling point of less than 120° C. at 1 atm. The low boiling point allows the weak electrolyte to evaporate during conditioning. In various embodiments, the solution has a pH from 6 to 8. The weak electrolyte does not etch the ceramic coating 212 and does not leave a contaminant residue after evaporation. In various embodiments, the electrolytes have a $K_a$ or $K_b$ value of around $10^{-5}$.

In various embodiments, the particles are dry ice. In such embodiments, the ceramic coating 212 is blasted with $CO_2$ in solid, liquid, and gas phases. The different phases of $CO_2$ improve the cleaning of organic residues. The cold temperature of the $CO_2$ particles cools the ceramic coating 212 and the residues. The particles of $CO_2$ may be $CO_2$ shavings or chips. $CO_2$ particles vaporize without leaving a residue. The difference between coefficients of expansion of the ceramic coating 212 and the residues further facilitate residue removal. The blasting reduces surface particles from both the ceramic itself and the surface coatings.

In various embodiments, drying the ceramic coating 212 may be accomplished by one or more of wiping the ceramic coating 212, blasting the ceramic coating 212 with a gas, such as $N_2$, clean dry air (CDA), heating the ceramic coating 212, spinning the ceramic coating 212, or letting the ceramic coating 212 stand at room temperature.

In various embodiments, the ceramic coating 212 may be of another dielectric plasma resistant ceramic, such as an yttrium or yttria-containing ceramic.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for conditioning ceramic coating on a part for use in a plasma processing chamber, comprising:
   wetting the ceramic coating with a solution, wherein the solution is formed by mixing a solvent with an electrolyte, wherein from 1% to 10% of the electrolyte dissociates in the solution;
   blasting the ceramic coating with particles; and
   rinsing the ceramic coating.

2. The method, as recited in claim 1, wherein the solvent is water.

3. The method, as recited in claim 1, wherein the particles are dry ice particles.

4. The method, as recited in claim 1, wherein the electrolyte has a boiling point of less than 120° C. at 1 atm.

5. The method, as recited in claim 1, further comprising drying the ceramic coating after rinsing the ceramic coating.

6. The method, as recited in claim 1, wherein the ceramic coating comprises at least one of alumina, yttria, or yttrium.

7. The method, as recited in claim 1, wherein the ceramic coating is a dielectric.

8. The method, as recited in claim 1, further comprising spraying the solution onto the ceramic coating during the blasting the ceramic coating with particles.

9. The method, as recited in claim 1, further comprising using the part as an electrostatic chuck in a plasma processing chamber.

10. The method, as recited in claim 1, further comprising using the part in a plasma processing chamber.

11. The method, as recited in claim 1, wherein the electrolyte evaporates without leaving a residue.

12. The method, as recited in claim 1, wherein the particles vaporize without leaving a residue.

13. The method, as recited in claim 2, wherein the electrolyte is ammonia acetate.

14. The method, as recited in claim 2, wherein the electrolyte is at least one of $NH_4BO_3$, $(NH_4)_2B_2O_7$, $(NH_4)_2CO_3$, $NH_4HCO_3$, $(NH_4)_2HC_6H_5O_7$, $NH_4CHO_2$, $NH_4C_3H_5O_3$, $(NH_4)_2C_2O_4$, $NH_4HC_2O_4$, $NH_4C_7H_5O_3$, $(NH_4)_2C_4H_4O_4$, $(NH_4)_2C_4H_4O_6$ or $NH_4HC_4H_4O_6$.

15. The method as recited in claim 3, wherein the particles are in at least one of solid, liquid, and gas phases.

16. The method, as recited in claim 3, wherein an electrostatic charge that builds up during the blasting the ceramic coating does not exceed a magnitude of 800 volts.

* * * * *